United States Patent
Ranstad et al.

(10) Patent No.: US 9,325,300 B2
(45) Date of Patent: Apr. 26, 2016

(54) METHOD FOR THE OPERATION OF ELECTROSTATIC PRECIPITATORS

(75) Inventors: Per Ranstad, Växjö (SE); Jörgen Linner, Växjö (SE); Jürgen Biela, Zürich (CH); Thiago Batista Soeiro, Zürich (CH)

(73) Assignee: ALSTOM Technology Ltd, Baden (CH)

( * ) Notice: Subject to any disclaimer, the term of this patent is extended or adjusted under 35 U.S.C. 154(b) by 643 days.

(21) Appl. No.: 13/701,055

(22) PCT Filed: Jun. 17, 2011

(86) PCT No.: PCT/EP2011/060129
§ 371 (c)(1),
(2), (4) Date: Mar. 25, 2013

(87) PCT Pub. No.: WO2011/157829
PCT Pub. Date: Dec. 22, 2011

(65) Prior Publication Data
US 2013/0194015 A1    Aug. 1, 2013

(30) Foreign Application Priority Data

Jun. 18, 2010 (EP) .................................... 10166564

(51) Int. Cl.
*B01D 53/02* (2006.01)
*H03K 3/36* (2006.01)
*H02M 7/493* (2007.01)

(52) U.S. Cl.
CPC *H03K 3/36* (2013.01); *H02M 7/493* (2013.01)

(58) Field of Classification Search
CPC ................................ H02M 7/493; H03K 3/36
See application file for complete search history.

(56) References Cited

U.S. PATENT DOCUMENTS

| | | |
|---|---|---|
| 6,628,106 B1 | 9/2003 | Batarseh et al. |
| 7,098,728 B1 | 8/2006 | Mei et al. |
| (Continued) | | |

FOREIGN PATENT DOCUMENTS

| | | |
|---|---|---|
| DE | 3904511 A1 | 8/1990 |
| DE | 19614195 C1 | 6/1997 |
| (Continued) | | |

OTHER PUBLICATIONS

Button R Ma et al., "Digital control technologies for modular DC-DC converters", National Aeronautics and Space Administration, Glenn Research Center, 2000 Aerospace Conference, Big Sky, Montana, Mar. 19-25, 2000; NASA/TM-2002-211369, Feb. 2002.
(Continued)

*Primary Examiner* — Christopher P Jones
(74) *Attorney, Agent, or Firm* — Rita D. Vacca

(57) ABSTRACT

The disclosure relates to a method for the scheduling and/or the operation of a system of at least two power supplies (11) providing DC pulses to a consumer (5), typically an electrostatic precipitator, wherein the power supplies (11) are energized by a common feeding (1). According to the proposed method one power supply (11) is defined to be the reference power supply, and the initial pulses of each further power supply (11) are shifted by controlled delays ($\delta_{Pri}$) with respect to the pulses of the reference power supply so as to fill the gaps between the pulses of the reference power supply by the pulses of the further power supplies (11).

14 Claims, 15 Drawing Sheets

(56) References Cited

U.S. PATENT DOCUMENTS

| | | | |
|---|---|---|---|
| 2004/0004440 A1* | 1/2004 | Krichtafovitch et al. | 315/111.91 |
| 2007/0297200 A1* | 12/2007 | Ranstad | 363/21.02 |
| 2009/0129124 A1 | 5/2009 | Ranstad | |

FOREIGN PATENT DOCUMENTS

| | | | |
|---|---|---|---|
| EP | 0046322 | A1 | 2/1982 |
| EP | 1995863 | A2 | 11/2008 |
| EP | 2001113 | A2 | 12/2008 |
| WO | 2009090165 | A2 | 7/2009 |

OTHER PUBLICATIONS

PCT International Search Report; PCT Application No. PCT/EP2011/060129, Applicant: ALSTOM Technology Ltd, Dated Mar. 21, 2012, Authorized Officer: Anton Roider.

European Search Report, EP Application No. 10166564.4, Dated Jan. 31, 2011, Munich.

* cited by examiner b)

c)

METHOD FOR THE OPERATION OF ELECTROSTATIC PRECIPITATORS

This is a US National Phase application claiming priority to International Application No. PCT/EP2011/060129 having an International Filing Date of Jun. 17, 2011, incorporated herein in its entirety by reference.

TECHNICAL FIELD

The present invention relates to a method for the scheduling and corresponding operation of a system of at least two power supplies providing pulsed direct current to a consumer, preferentially an electrostatic precipitator, wherein individual power supplies are energised by a common feeding.

PRIOR ART

With the increasing concern for environmental pollution, the reduction of particle emissions by using Electrostatic Precipitators (ESPs) is a highly important issue for coal fired power plants. ESPs are highly suitable dust collectors. Their design is robust and they are very reliable. Moreover, they are most efficient. Degrees of separation above 99.9% are not unusual. Since, when compared with fabric filters, their operating costs are low and the risk of damage and stoppage owing to functional disorders is considerably smaller, they are a natural choice in many cases. In an ESP, the polluted gas is conducted between electrodes connected to an ESP power supply. Usually, this is a high-voltage transformer with thyristor control on the primary side and a rectifier bridge on the secondary side. This arrangement is connected to the ordinary AC mains and thus is supplied at a frequency, which is 50 or 60 Hz. The power control is effected by varying the firing delay of the thyristors. The smaller the firing angle, i.e. the longer the conducting period, the more current supplied to the ESP and the higher the voltage between the electrodes of the ESP. Modern ESPs are divided into several bus sections for increasing the collection efficiency. Each of these bus sections has its own power supply (PS), which is controlled individually and has a typical output power range of 10-200 kW and an output voltage range of 30-150 kVDC.

Modern ESP's power supplies are often based on resonant converters in order to utilize the transformer's nonidealities and to have soft switching for a wide operation range. One exemplary power supply for ESPs is known from US 2009/0129124.

SUMMARY OF THE INVENTION

Modern ESP's are often operated in pulsed mode. Pulsed operation considerably influences the mains power quality, since it can result in high line current distortion (total harmonic distortion) and unbalanced mains phase loading. Thus, interruption and malfunction of equipment fed by a common feeding (the same mains), audible noise, heating in transformers, generators and power lines, electric resonance in the mains, mechanical oscillations in generators, engines, etc. can be caused. These problems can become worse if, for example, a group of individual power supplies with pulsed operation are fed by the same common feeding (mains), since the pulses in different supplies can occur at the same instant (critical case). On the other hand, if the pulses in each power supply are scheduled in an optimal way it should be possible to reduce the undesirable effects in this type of operation, so that the power consumption becomes more continuous in time (optimized case). At the moment, the power supplies for ESP application do not use any strategy for pulse scheduling; therefore arbitrary current waveform at the input occurs.

This is where the present invention has its origin, proposing a new and improved method for the operation of at least two individual power supplies connected to the same common feeding (mains), said power supplies destined to provide pulsed power output, such as e.g. for the pulsed operation of one or several ESPs operated with said power supplies.

So this invention deals with mains' energy quality optimization for a group of power supplies feeding an Electrostatic Precipitator (ESP) with pulsed operation.

The optimization strategy that will be presented here can be applied to any group of power supplies operating in pulsed mode. Thereby, a considerable improvement of the line current by just controlling the starting time of the different pulses can be achieved without any additional means.

Other strategies than the one presented here that could theoretically be used for the same intent reduce the system reliability and/or increment the implementation complexity, unreliability and costs.

The "best case" for an ESP system occurs when all supplies at full load operate feeding the ESP with continuous power, where the mains' phase currents are balanced and the relation between the average value of the power consumption and the harmonic components are at the lowest. Considering this, the main idea of this optimization is to arrange the pulses in an optimal sequence, so that the group of pulsed power supplies has similar line behaviour to that which an equivalent single power supply, which operates in continuous mode, would have.

So one of the cores of the invention can be summarized as follows:

The method used to arrange the pulses in an optimal sequence is by shifting the initial pulses of each individual power supply by a delay time with respect to one reference. Here, the bus section with the largest pulse period is taken as reference for the others and the aim is to fill the gaps between the reference pulses by the pulses of the other power supplies. This process continues until all power supplies are analyzed.

Best behavior is observed when the pulses are essentially uniformly distributed within the reference pulse period and by shifting all pulses of one bus section by the same delay with respect to the other bus sections.

More specifically, a method for the scheduling and corresponding operation of a system of at least two individual power supplies providing DC pulses to a consumer, preferentially an electrostatic precipitator, is proposed, wherein the individual power supplies are energised by a common feeding (mains). In accordance with a primary aspect of the present invention, the scheduling is carried out in that one power supply, typically the one with the largest pulse period, is defined to be the reference power supply, and the initial pulses of each further power supply are shifted by controlled delays $\delta_{Pri}$ with respect to the pulses of the reference power supply so as to fill the gaps between the pulses of the reference power supply by the pulses of the further power supplies.

Preferentially the filling of the gaps between the pulses of the reference power supply is done in that the controlled delays $\delta_{Pri}$ are determined so as to essentially uniformly distribute the pulses of the further power supplies in the pulse period of the reference power supply.

Further preferably, this means that if the accumulated pulse width of all power supplies is smaller than the largest pulse period, the controlled delays $\delta_{Pri}$ are determined such that the gaps between all pulses are essentially identical.

If on the other hand the accumulated pulse width of all power supplies is essentially equal to the largest pulse period, which means that the pulses so to speak fit within this largest pulse period, the controlled delays $\delta_{Pri}$ are determined such that there are no gaps between all pulses (pulses arranged temporally adjacent to each other).

If on the other hand the accumulated pulse width of all power supplies is larger than the largest pulse period, the overlap length of all pulses is adapted to be equal.

This can be done systematically by using analytical calculations. Indeed quite surprisingly the following has been found when comparing the proposed analytical calculations given below with burdensome optimisation calculations (steepest descent, random walk, simulated annealing, genetic algorithms, conjugate gradient methods etc): In particular for larger numbers (#) of power supplies the obtained instant power drain (IPDM) from common feeding (mains) distribution, which can be regarded essentially as one quality function of such an optimisation, as well as the harmonic distortions etc, which the analytical calculations as proposed further below provide are an at least equal but much more readily available scheduling than computationally difficult and expensive optimisations.

Specifically according to this analytical calculation the delays $\delta_{Pri}$ of the further power supplies are calculated sequentially using the following formula:

$$\delta_{Pri} = k \frac{T_{P_r} - \sum_{z=1}^{n_{PS}} PW_{PSz}}{n_{PS}} + PW_{PSr} + \sum_{z \neq r=0}^{i-1} PW_{PSz} \quad (1)$$

wherein $\delta_{Pri}$ is the controlled delay of power supply i, $T_{P_r}$ is the pulse period of the reference power supply with the largest pulse period, $n_{PS}$ is the total number of power supplies in the system operated in pulsed mode, $PW_{PSz}$ is the pulse width of the power supply with index z, $PW_{PSr}$ is the pulse width of the reference power supply and k is the running index incremented for each subsequent calculation of the controlled delay for the subsequent power supply.

Most efficiently, this calculation is carried out in that in a first step, the power supply with the largest pulse period $T_{P_r}$ is selected, in a second step the indices 1 and k are set to 1, in a third step it is verified whether the considered power supply is that the reference power supply, if yes $\delta_{Pri}$ is set to 0, i incremented by one and the process continues at above second step, if no $\delta_{Pri}$ is calculated according to a formula (1), the running index k is incremented by one, and if the value of i is still smaller than the total number $n_{PS}$ of power supplies, the index i is also incremented by one and the process continues at above second step, and if the value of i is equal to or larger than the total number of power supplies, the calculation is terminated. This is essentially according to the flow diagram as illustrated in FIG. 9 given further below.

Very often, in particular in case of an electrostatic precipitator, such a system comprises at least two groups of power supplies with at least two power supplies each, wherein within each group the power supplies are operated with essentially the same pulse period, preferably also essentially with the same pulse period, and wherein within each group the power supplies are preferably also operated essentially with the same pulse width. In such a situation it can be shown that the above analytical calculations are most efficiently carried out if in a first optimisation step independently in each group the power supplies within each group are scheduled by corresponding determination of the controlled delays $\delta_{Pri}$ so as to fill the gaps between the pulses of a reference power supply of the group by the pulses of the further power supplies of the group. Essentially this means that the calculation using the flow diagram according to FIG. 9 is carried out from each group and within each group completely independently.

According to a preferred embodiment said first optimisation step is followed by a second optimisation step, in which the groups are scheduled relative to each other by corresponding determination of the controlled delays $\delta_{Pri}$ so as to fill the gaps between the pulses of the individual groups, taking the group with the largest pulse period as the reference power supply, wherein during this second optimisation step the scheduling within each group is not modified. Essentially this means that while keeping the scheduling within one group constant, the groups are scheduled relative to each other again using the flow diagram according to FIG. 9.

In the alternative for a situation where the system comprises at least two groups of power supplies with at least two power supplies each, wherein within each group the power supplies are operated with essentially the same pulse period, preferably also essentially with the same pulse period, it is possible to schedule as follows: sequentially the controlled delays $\delta_{Pri}$ are determined within a first group with the largest pulse period for each other power supplies within that first group, followed by sequential determination of the controlled delays of each of the power supplies of the following groups.

Essentially this means that one first optimises the first group with the longest pulse period using the flow diagram according to FIG. 9, then works through a second group, a third group, and so forth using the flow diagram individually for each of the power supplies in the group.

In the alternative it is possible to proceed as follows: sequentially the controlled delays $\delta_{Pri}$ are determined for a first power supply of a first group with the largest pulse period followed by the determination of the controlled delay the first power supply of a second group until the first power supplies of all groups have been attributed a controlled delay, followed by the determination of the controlled delay of the second power supply of the first group, until the second power supplies of all groups have been attributed a controlled delay, and so forth for the further groups until all power supplies have been attributed a controlled delay. Essentially this means that a strategy is used which is described further below as "by row" optimisation.

Preferentially, the power supplies used are high voltage transformer based, preferably IGBT based converters, preferably series loaded resonant converters allowing to have higher power and high voltage, preferably said high power being in a range of 10-200 kW and/or said high voltage being in a range of 50-150 kV DC.

Typically and in particular for applications with electrostatic precipitators the DC pulses provided to the consumer have pulse widths in the range of 0.1-20 ms, and/or have pulse periods in the range of 0.5 ms-2 s, wherein preferably the pulse ratio defined as the pulse width divided by the pulse period in the range of 1-1/2000.

It is possible to use the proposed scheduling also in combination with bus sections where there are power supplies attached to the same common feeding (mains) operated in continuous mode. The electrostatic precipitator may thus comprise at least one bus section for pulsed operation and at least one further bus section for continuous operation.

According to yet another preferred embodiment, the consumer is an electrostatic precipitator operated in at least one bus section in pulsed mode and comprising at least one further bus section operated in pulsed mode, preferably comprising at least one further bus section operated in pulsed mode, and wherein in each bus section at least two, preferably at least three individual power supplies are provided, all power supplies of the precipitator being energised by a common feeding.

The present invention furthermore relates to the use of the method as defined above for the operation of an industrial application with an electrostatic precipitator acting as a (combustion) gas cleaning unit e.g. of a power plant, preferably of a fossil fuel-based power plant, most preferably of a coal-fired power plant. The electrostatic precipitator unit can also be used for another dust producing process such as a sinter band sieving system, a cement manufacturing process, or the like.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Usually an ESP system is divided into several bus sections to improve the particulate collection efficiency. In small systems, only 2 or 3 bus sections are connected in series and in large ones, several bus sections are connected in parallel and in series. Different power supplies with different power ratings often energize the bus sections in order to optimize the collection efficiency of the bus sections.

Figure 1:
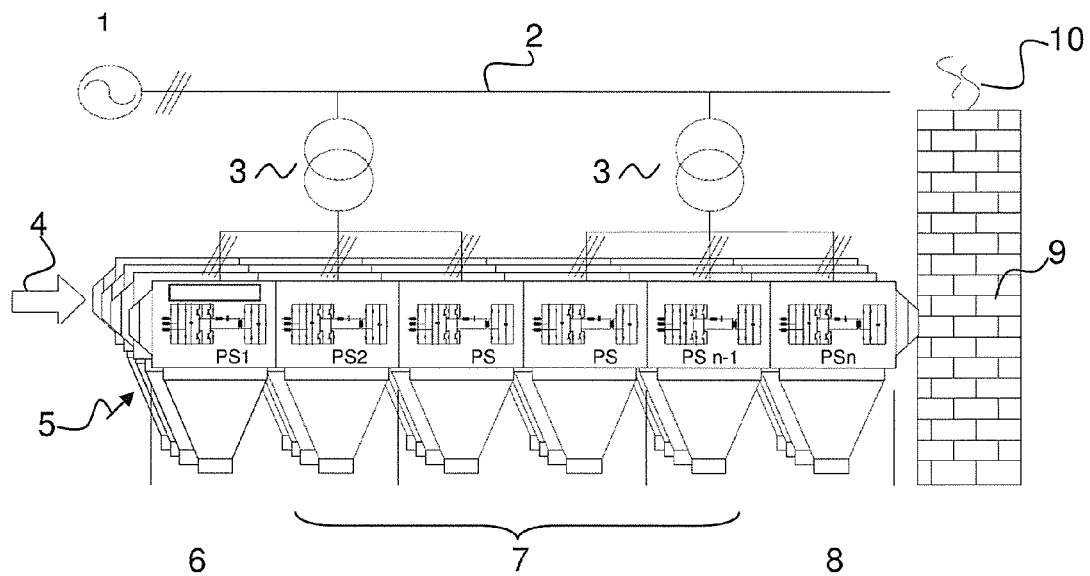
FIG. 1 shows a typical ESP installation scheme, specifically a system with several sequential bus sections driven by 24 power supplies.

FIG. 1 shows a typical ESP installation with several sequential bus sections driven by 24 power supplies. The electrostatic precipitator 5 comprises an inlet side trough which a gas flow 4 loaded with particles, e.g. coal dust, enters the ESP. The ESP has an inlet field 6, followed by middle fields 7 and is terminating by an outlet field 8, the outlet of which is connected to a stack 9 through which the cleaned exhaust gas 10 exits to the environment. Each of the fields 6-8 has two rows of individually powered precipitator systems (four cells and six fields), leading to 24 bus sections, and to this end 24 power supplies (PS) are provided for the energisation of the precipitators. The general topology of such a power supply will be discussed further below. The power supplies are energized via the mains 1, a common feeding, which via a low or medium voltage line 2 and distribution transformers 3 connects to the individual power supplies. In other words the totality of the power supplies is connected to a common feeding system 1 and if these power supplies or at least a fraction thereof are operated in pulsed mode the load on the main can be heavily unbalanced.

Figure 2:
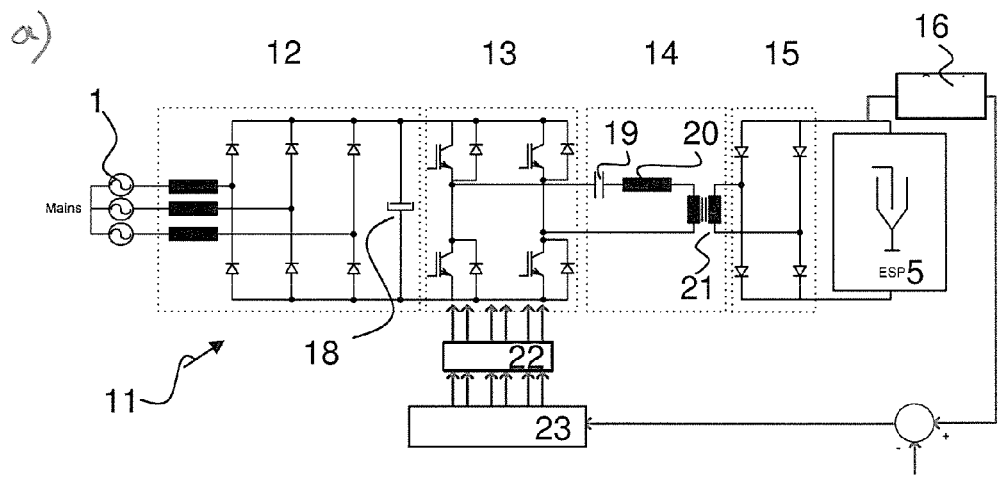
FIG. 2 a) shows a schematic of a single high frequency ESP power supply, b) a schematic of a typical single phase mains frequency ESP power supply, c) a schematic of a high frequency power processing ESP power supply.
Figure 2:
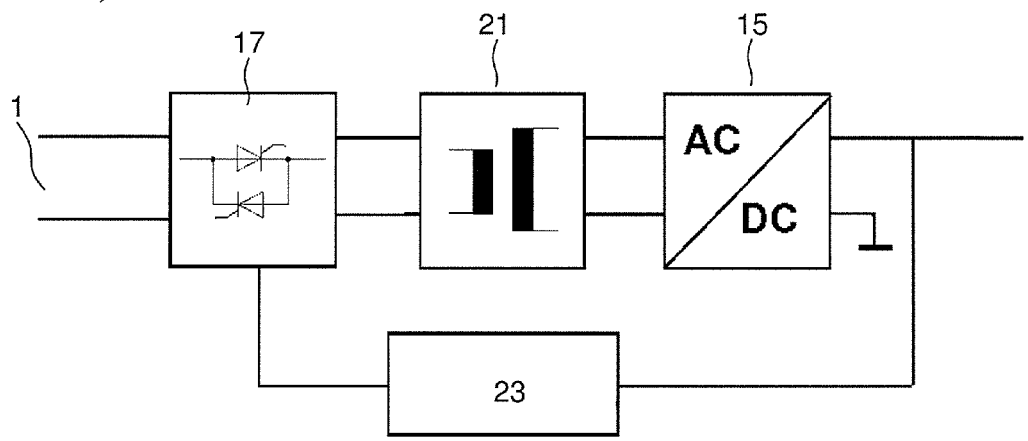
Figure 2:
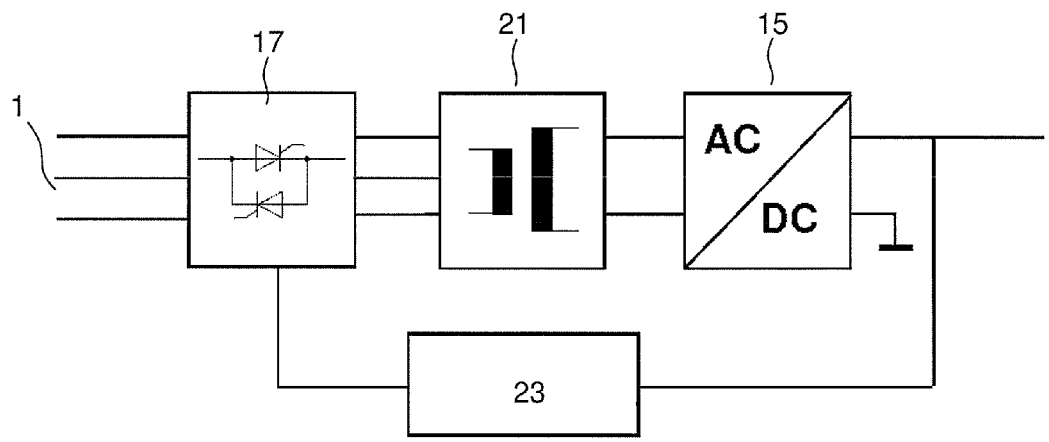

A high frequency three phase mains power supply 11 for powering one of the individual precipitators in a setup according to FIG. 1 is illustrated in FIG. 2a. On the input side the power supply 11 is connected to the mains 1 and first comprises an input rectifier 12. At the output side of the input rectifier 12 a direct current (DC) is provided and between the levels there is located a DC link capacitor 18. This direct current is then fed trough a full bridge inverter 13 with a number of correspondingly fired transistors. The operation of the full bridge inverter 13 is controlled by drivers 22 in turn controlled by a control unit 23. The alternating current on the output side of the full bridge inverter 13 enters a resonant tank and transformer unit 14, the resonant circuit given by a series arrangement of a capacitor 19 and an inductor 20 followed by a transformer 21. On the output side the unit 14 is coupled to an output rectifier 15 the output side of which is then coupled to the electrodes of the electrostatic precipitators 5.

For pulsed operation of such a power supply the full bridge inverter is operated in pulsed mode via the control unit 23 and the drivers 22. In order to control the whole system there is provided a current and voltage sensor 16 the output of which is used for controlling the unit 23.

The present invention is not limited to high frequency three-phase power supplies as illustrated in FIG. 2a and also further schematically in FIG. 2c, which typically operate at a frequency in the resonant tank in the 20-200 kHz range. Also possible are mains frequency power processing units as illustrated in FIG. 2b, where a single phase mains 1 is switched in unit 17, transformed by a transformer 21 and rectified for the final use at the ESP after the output rectifier 15.

Figure 3:
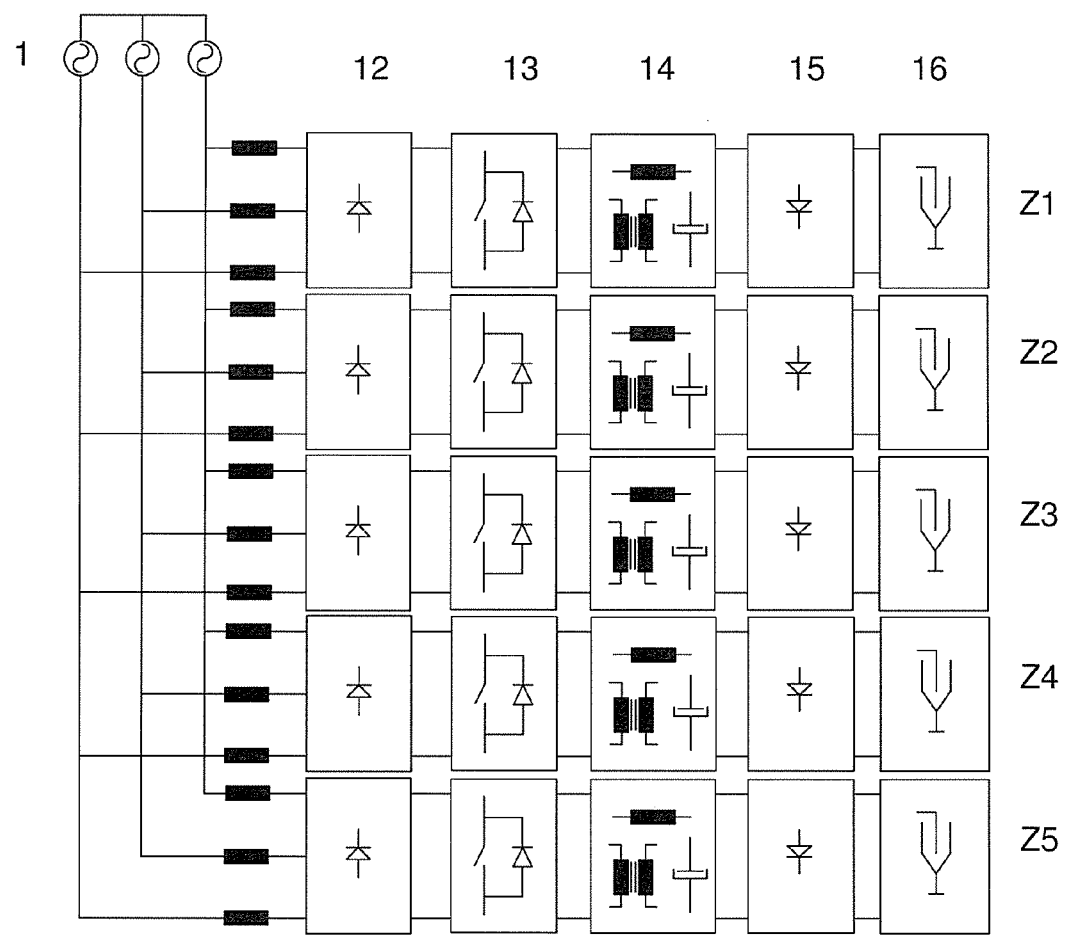
FIG. 3 shows a system of 5 power supplies feeding an ESP system.

To illustrate the effects of the pulsed energization on the mains' energy quality a system of five power supplies was simulated (cf. FIG. 3), attached to an electrostatic precipitator (or to a group of electrostatic precipitators) with five bus sections Z1-Z5. For this example, three operation conditions are evaluated and the results can be seen in FIGS. 4-6:

1—The "Critical Case": The power supplies operate in pulsed mode with pulse widths of 3 ms and periods of 12 ms. However, the pulses of all power supplies are scheduled to occur at the same time enhancing the mains quality problems (FIG. 4).

2—The "Optimized Case": The power supplies operate in pulsed mode with the same pulse configuration as the "Critical Case". Here, the pulses are equally distributed in a pulse period in order to attain more continuous power consumption (FIG. 5).

3—The "Best Case". All power supplies operate in continuous mode. This system was configured to require the same amount of power as the "Optimized Case". The mains behavior observed here is the target of the optimization by scheduling of pulses (FIG. 6).

Figure 4:
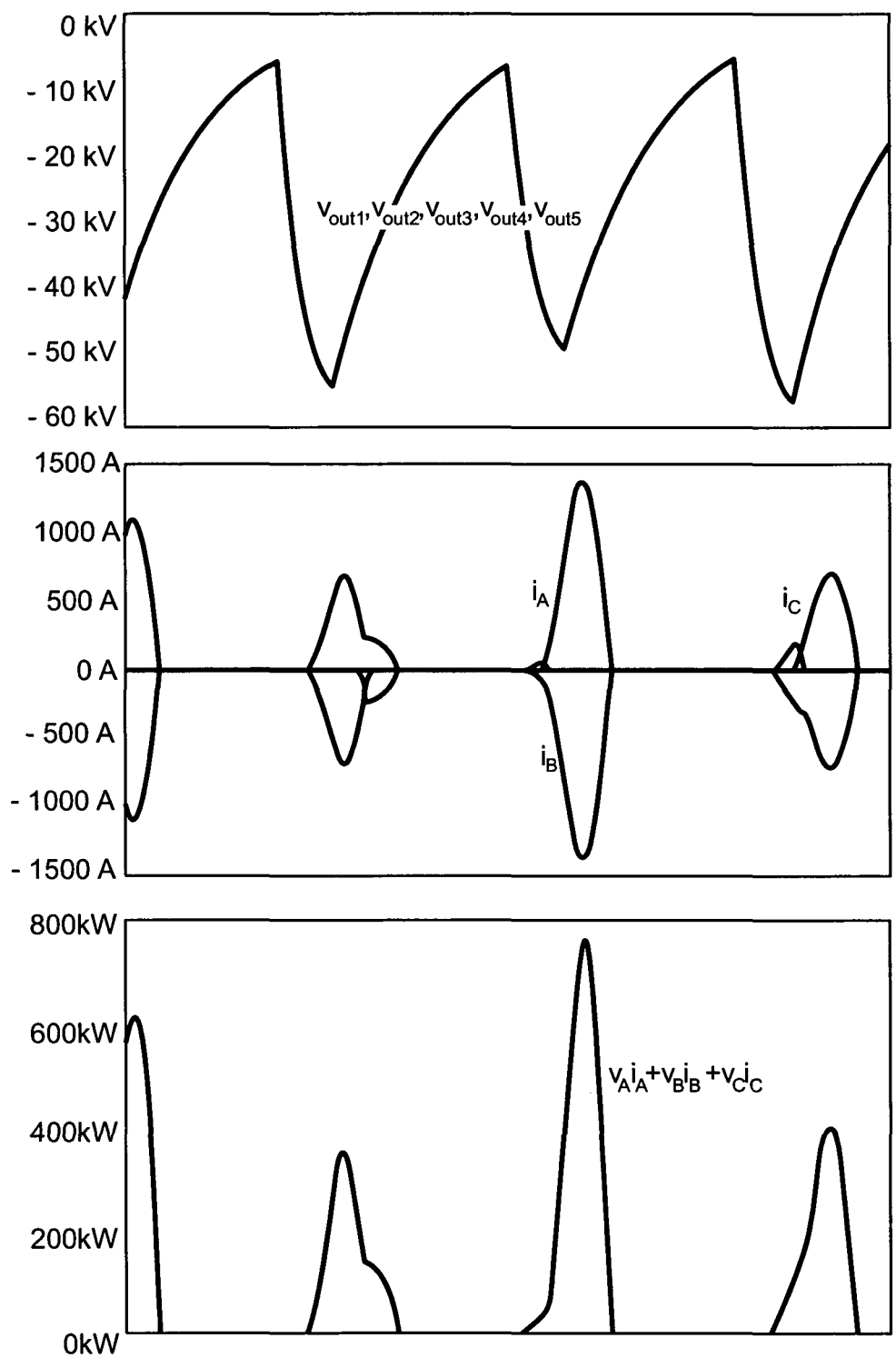
FIG. 4 for the "critical case" shows in (a) the voltage applied on the ESP electrodes by each power system's power supply, in (b) the mains' phase current, and in (c) the instant power drained from the mains, wherein the mains voltage is purely sinusoidal and for that the oscillation observed on the instant power waveform is due to the line current.
Figure 5:
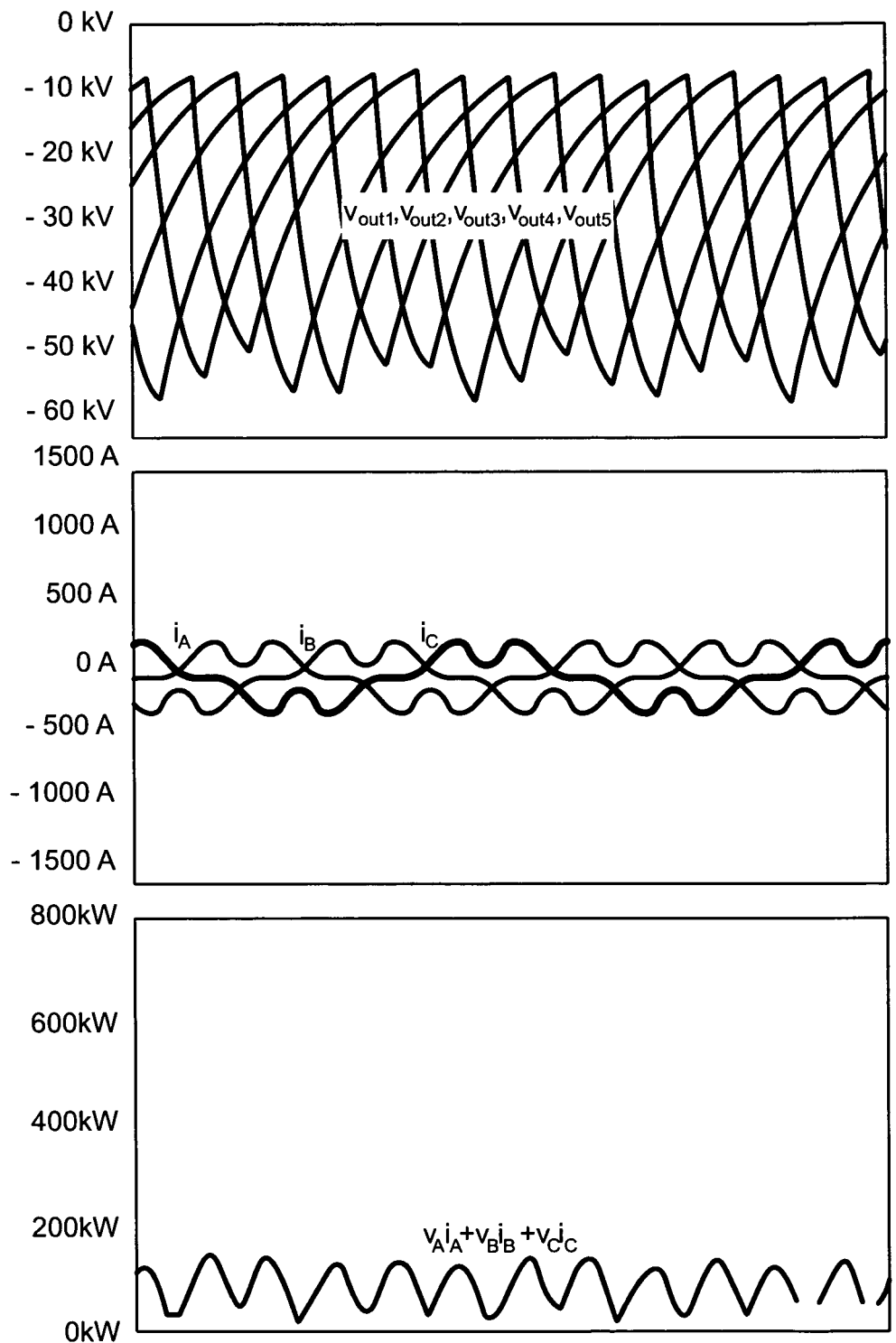
FIG. 5 for the "optimised case" shows in (a) the voltage applied on the ESP electrodes by each power system's power supply, in (b) the mains' phase current, and in (c) the instant power drained from the mains, wherein the mains voltage is purely sinusoidal and for that the oscillation observed on the instant power waveform is due to the line current.
Figure 6:
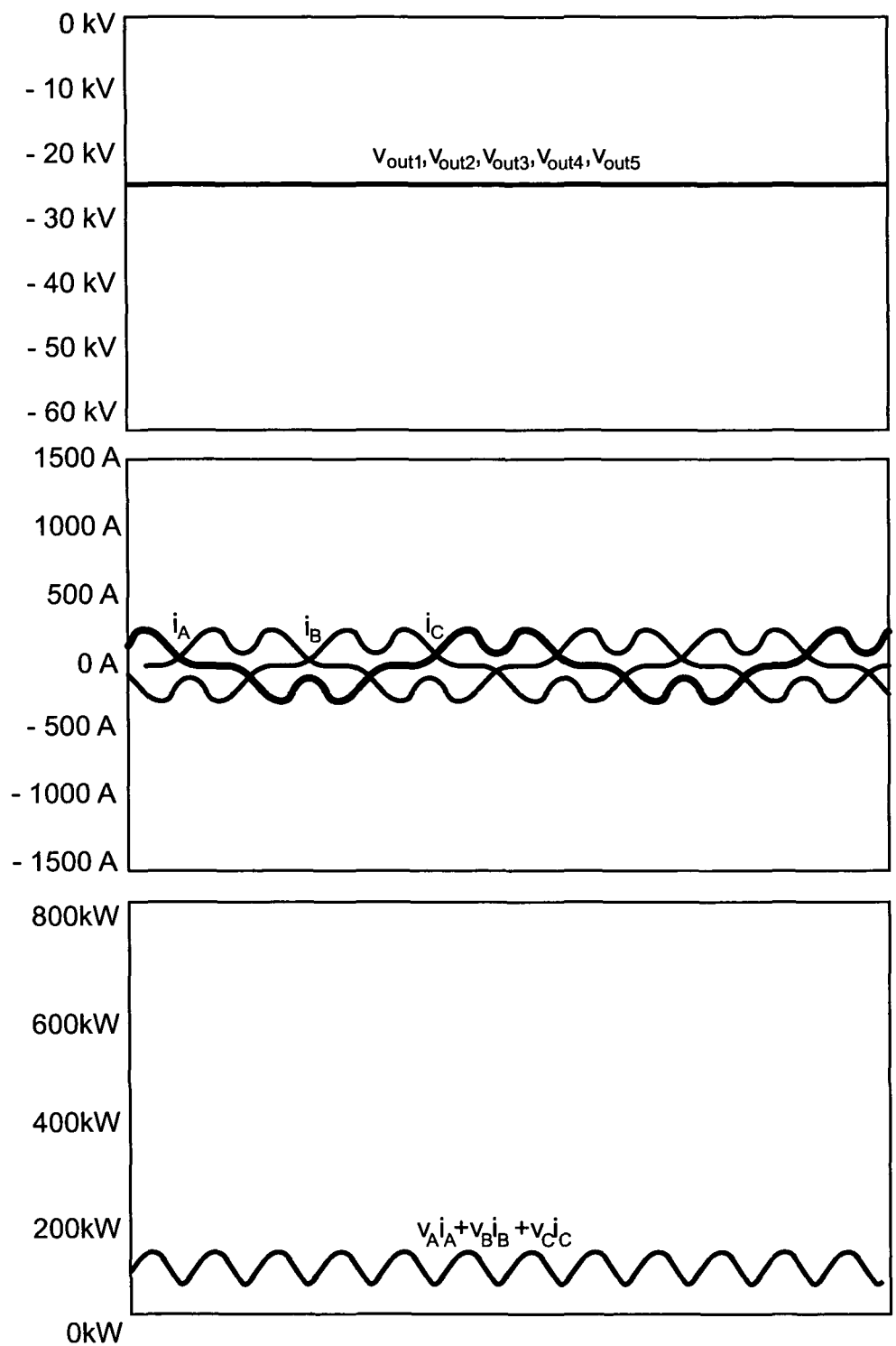
FIG. 6 for the "best case" shows in (a) the voltage applied on the ESP electrodes by each power system's power supply, in (b) the mains' phase current, and in (c) the instant power drained from the mains, wherein the mains voltage is purely sinusoidal and for that the oscillation observed on the instant power waveform is due to the line current.

As can be observe in FIGS. 4-6 the results obtained with the "Optimized Case" have very similar behavior to the "Best Case" system, where the line currents are balanced with harmonic distortion significantly better, when compared to the "Critical Case".

Figure 7:
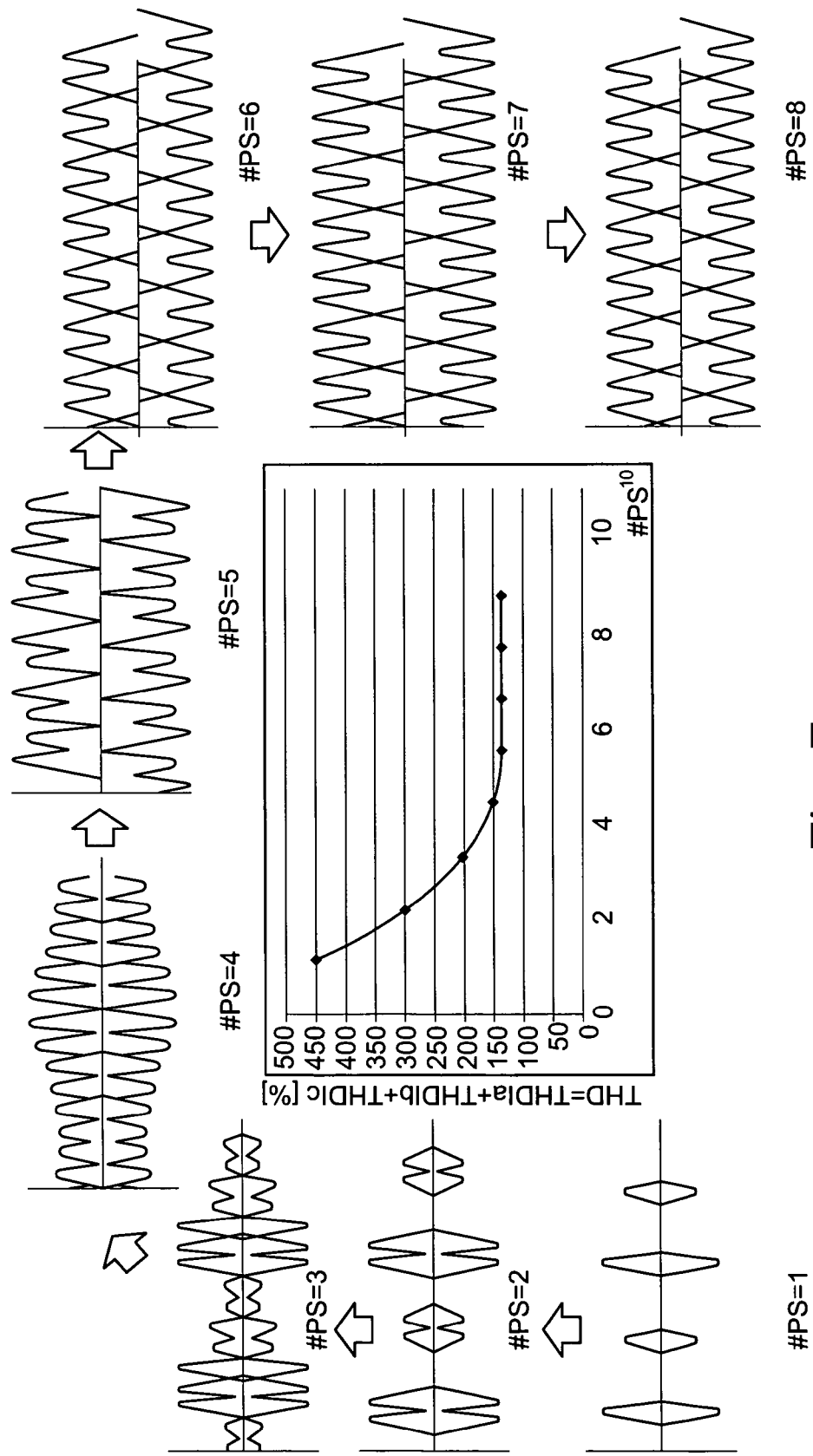
FIG. 7 shows the scheduling of pulses applied to different numbers of PS, wherein on the bottom left the instant power drained from the mains is shown for a single power supply, in the graph above for two power supplies, followed in clockwise direction by graphs showing the corresponding situation for 3, 4, 5, 6, 7 and 8 power supplies, respectively, and wherein in the centre the total harmonics distortion level is indicated as a function of the number of power supplies optimised, all this for a pulse period of 12 ms and a pulse width of 3 ms.

FIG. 7 shows the results of the optimization by scheduling applied to different numbers (#) of power supplies PS operating with the same pulse configuration (pulse period: 12 ms, pulse width: 3 ms; #PS=1 stands for one power supply, #PS=2 stands for two power supplies and so forth up to #PS=8 standing for eight power supplies). Analyzing the results one can observe that as soon as the distribution of pulses fill all the spaces between pulses in a pulse period, the gain in THD reduction for any additional power supply is small. However, the power balance behavior required from the mains continues improving. Doing the same using numerically calculated optimisations no significantly better results can be obtained then by using the analytical calculations as in particular proposed further below.

Figure 8:
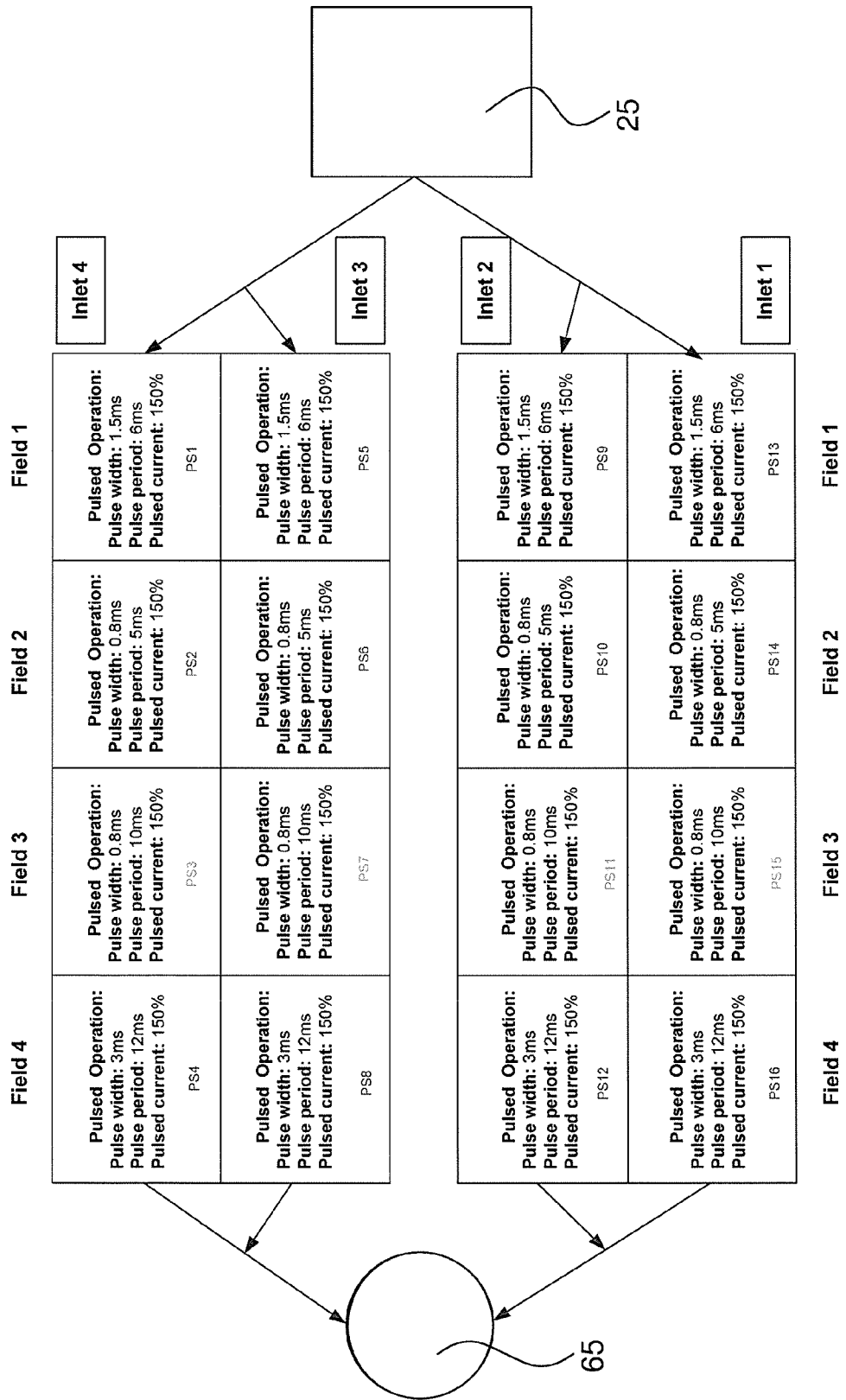
FIG. 8 shows arrangements and pulse parameter settings for each power supply in the considered ESP system, wherein it is supposed that all power supplies are operating in pulsed mode handling 120 kW and wherein in the case of one or more supplies operating continuous mode they will be considered optimised.

For deriving the optimization strategy, a system of 16 power supplies (PS1-PS16) divided into fields and feeding an ESP with pulsed voltages is taken as example (cf. FIG. 8). However, the scheduling of pulse strategy can be used in any system with similar properties. Here, the case where the individual pulses of a system are optimized according their "fields" will be considered, because this leads to the better mains' quality of energy behavior. In an optimized state, there is a better equilibrium of power consumption among the system's cells and therefore they have very similar particle collection efficiency. These interpretations are valid for any system where a field has only power supplies with the same pulse configurations, what is commonly the case.

Optimization Procedure:

The schedule of pulses is optimized by shifting the initial pulses of each power supply by a delay time with respect to one reference. Here, the field with the largest pulse period ($T_{pr}$) is taken as reference for the others and the aim is to fill the gaps between the reference pulses by the pulses of the other power supplies, so that the system power consumption becomes as continuous as possible. This process continues until all power supplies are analyzed.

Figure 9:
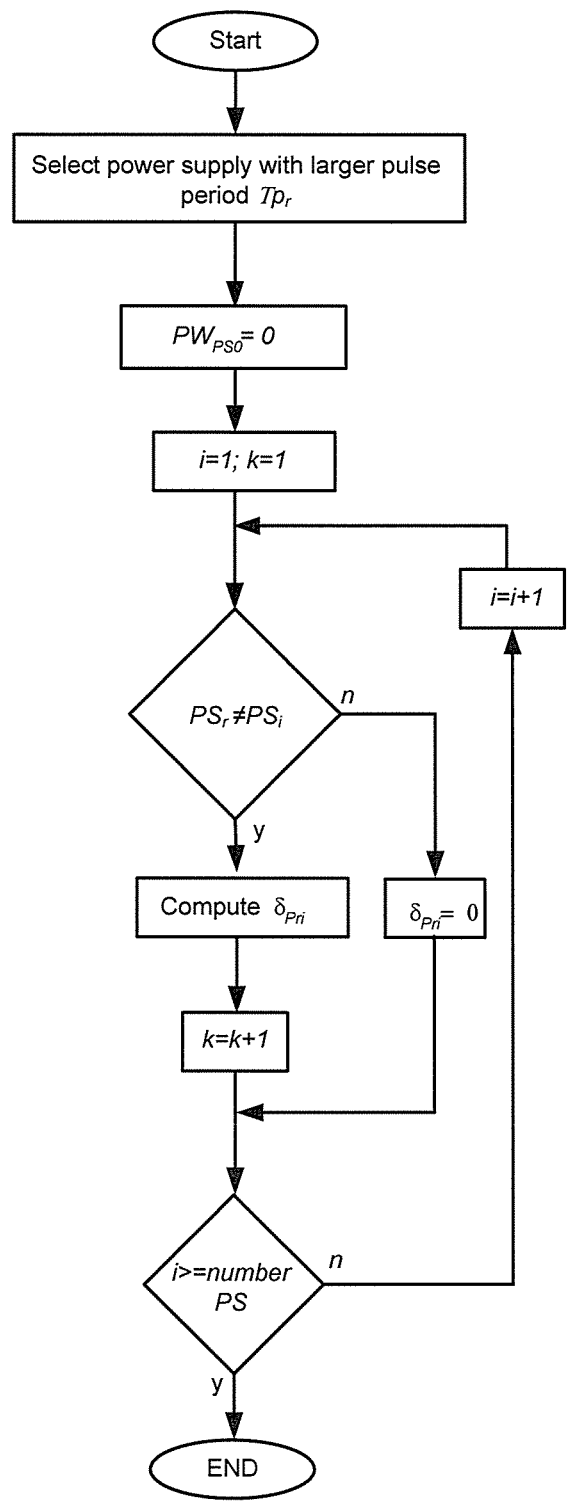
FIG. 9 shows a flow chart describing the polls optimisation procedure of the system of power supplies.

The flowchart describing this optimization procedure is shown in FIG. 9. The variables $\delta_{Pri}$ and gap are given by expressions (1) and (2) respectively, where $n_{PS}$ is the number of power supplies being optimized and $PW_{PSi}$ is the power supply i pulse width.

$$\delta_{Pri} = k \frac{T_{p_r} - \sum_{z=1}^{n_{PS}} PW_{PSz}}{n_{PS}} + PW_{PSr} + \sum_{z \neq r=0}^{i-1} PW_{PSs} \quad (1)$$

$$gap_{Fj} = \frac{T_{p_r} - \sum_{z=1}^{n_{PS}} PW_{PSz}}{n_{PS}} \quad (2)$$

During the optimization the gaps between the pulses are filled with other pulses. There, basically two results are possible:

1) the gap between the pulses is large enough that all pulses which should fit in do not overlap with each other. This is shown in FIG. 10a).

Figure 10:
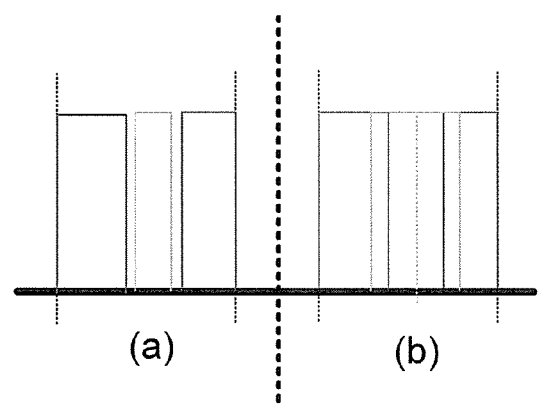
FIG. 10 shows the two different strategies for establishing delay time of the optimisation process.

2) The sum of pulse widths is longer than the gap, so that it overlaps as shown in FIG. 10b).

In principle there are different possibilities as to where to place the pulses and to calculate the delay times, but the best behavior is observed when the pulses are uniformly distributed in the reference pulse period as considered here.

Figure 11:
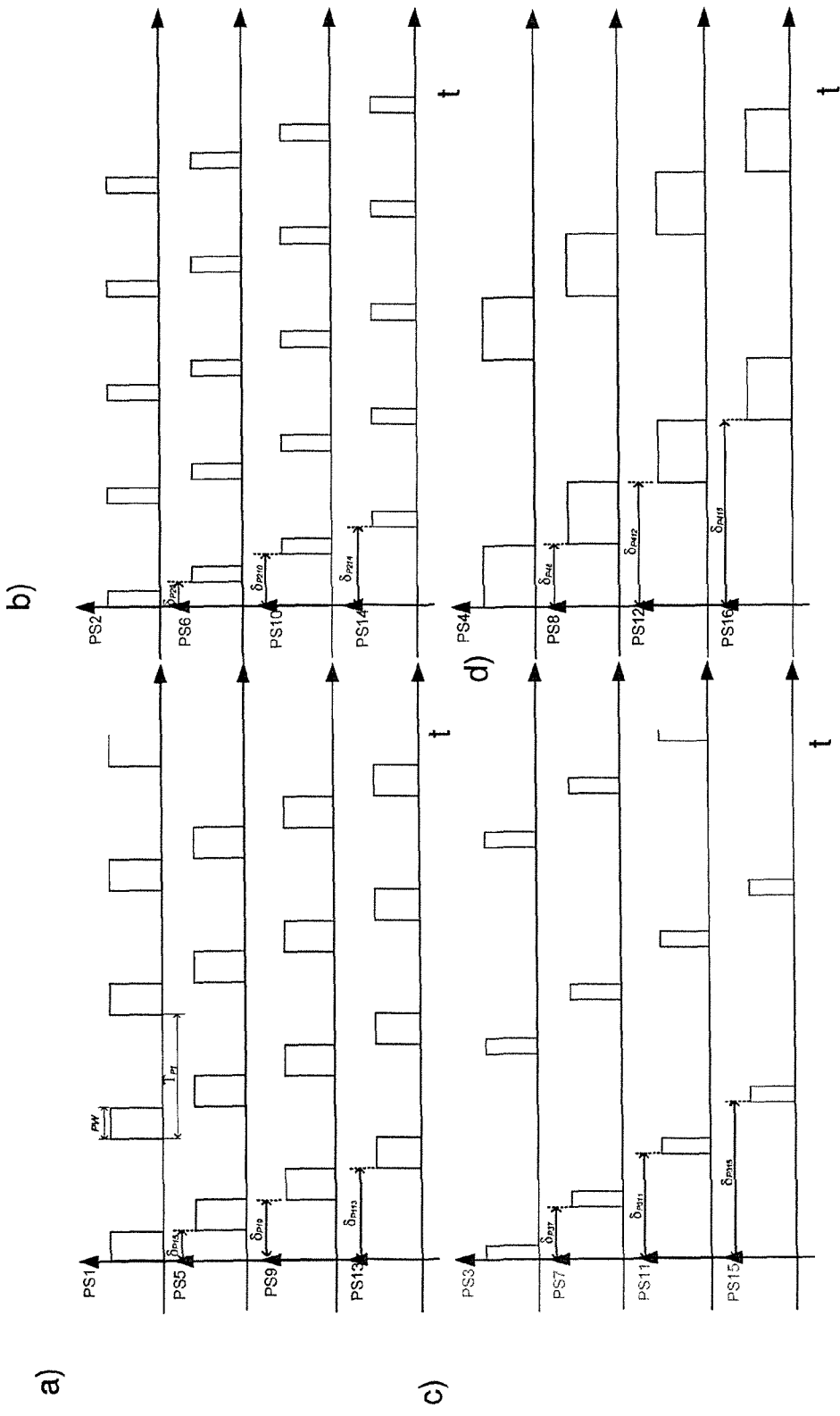
FIG. 11 shows the distribution of pulses in a system of power supplies feeding an ESP, wherein in (a) field 1 is shown, in (b) field 2, in (c) field 3 and in (d) field 4.
Figure 12:
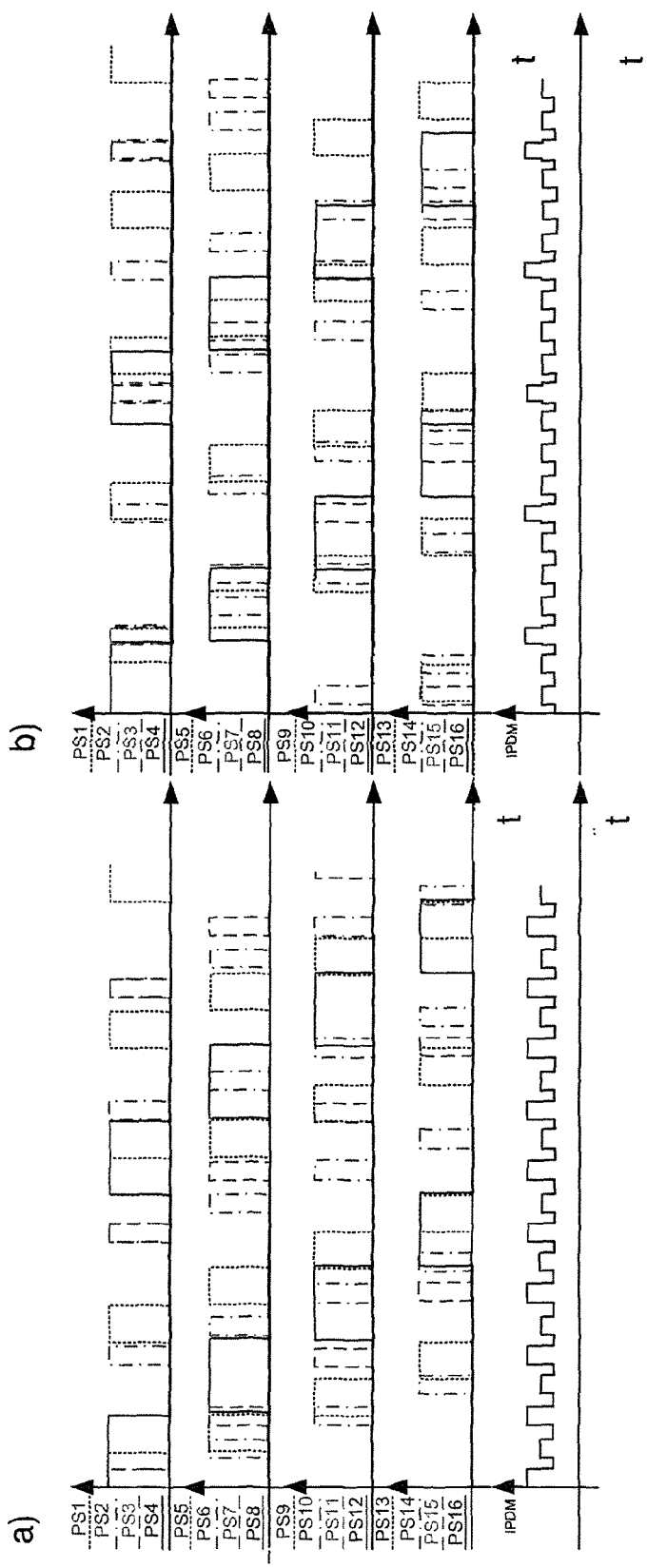
FIG. 12 shows the distribution of the pulses in a system of power supplies feeding an ESP, wherein in (a) the resulting sequence after the optimisation procedure step 1 and in (b) the resulting sequence after the optimisation steps 1 and 2 are shown.
Figure 13:
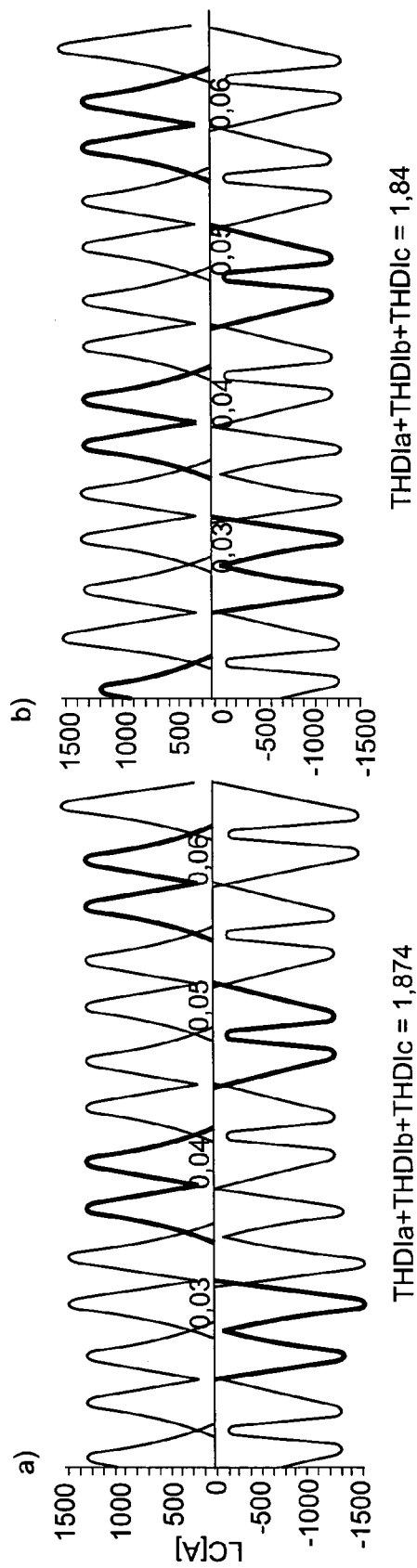
FIG. 13 shows the system line current for arrangement of pulses described in FIG. 12, wherein in (a) the situation after the optimisation step 1 and in (b) the situation after optimisation steps 1 and 2 are shown.

The optimization procedure evolves in two steps using for both the flowchart depicted in FIG. 9:

1—All fields are optimized separately. Here, the pulses in each field are distributed uniformly in a period as presented in FIG. 11. As can be observed in FIGS. 12a) and 13a), good results in mains' quality can already be obtained by only considering this step without further effort to establish any control interaction between pulses in different fields. However, for better results the next step is appropriate;

2—Optimization between fields. The schedule of the pulses of different fields is optimized by shifting all pulses of one field by the same delay with respect to the other fields. In this way, only the time delay between the pulse references of each field needs to be determined. Thus, the optimization evolves considering only the first row of the system. FIGS. 12b) and 13b) present the results of this optimization procedure. Here, the field with the largest pulse period between the fields is taken as reference for the other fields; however similar behavior would be obtained by selecting the field presenting the largest remained gap for that task.

The goal of the optimization is to obtain an Instant Power Drained from the Mains (IPDM) as continuous as possible. In the IPDM analysis, it was supposed that the power supplies only drain power from the mains when they are pulsing. However, the converter topology, depicted in FIG. 2 continues demanding power after pulsing stops until the mains phases' currents cross zero, and it only starts requiring power when the dc voltage link drops below the line voltage value (diode's conduction). This characterizes a time delay on the power consumption and depending on the amount of power handled it could benefit the balance of power by eliminating the remained gaps for that system. The optimal behavior of the line still occurs when all the system's pulses are equally distributed in time.

It is worthwhile to mention that using slightly different strategies using the theory explained (flowchart FIG. 9), similar results as the one presented above can be derived. For example, the individual pulses can be optimized considering the overall system instead of the optimization by fields. In this case, after definition of the pulse reference, the optimization strategy can evolve following the ordering by field (PS1, PS5, PS9, PS13, PS2, ..., PS16) or by row (PS1, PS2, PS3, PS4, PS5, ..., PS16). The result of both strategies applied to the ESP system shown in FIG. 8 can be seen in FIGS. 14 and 15.

Figure 14:
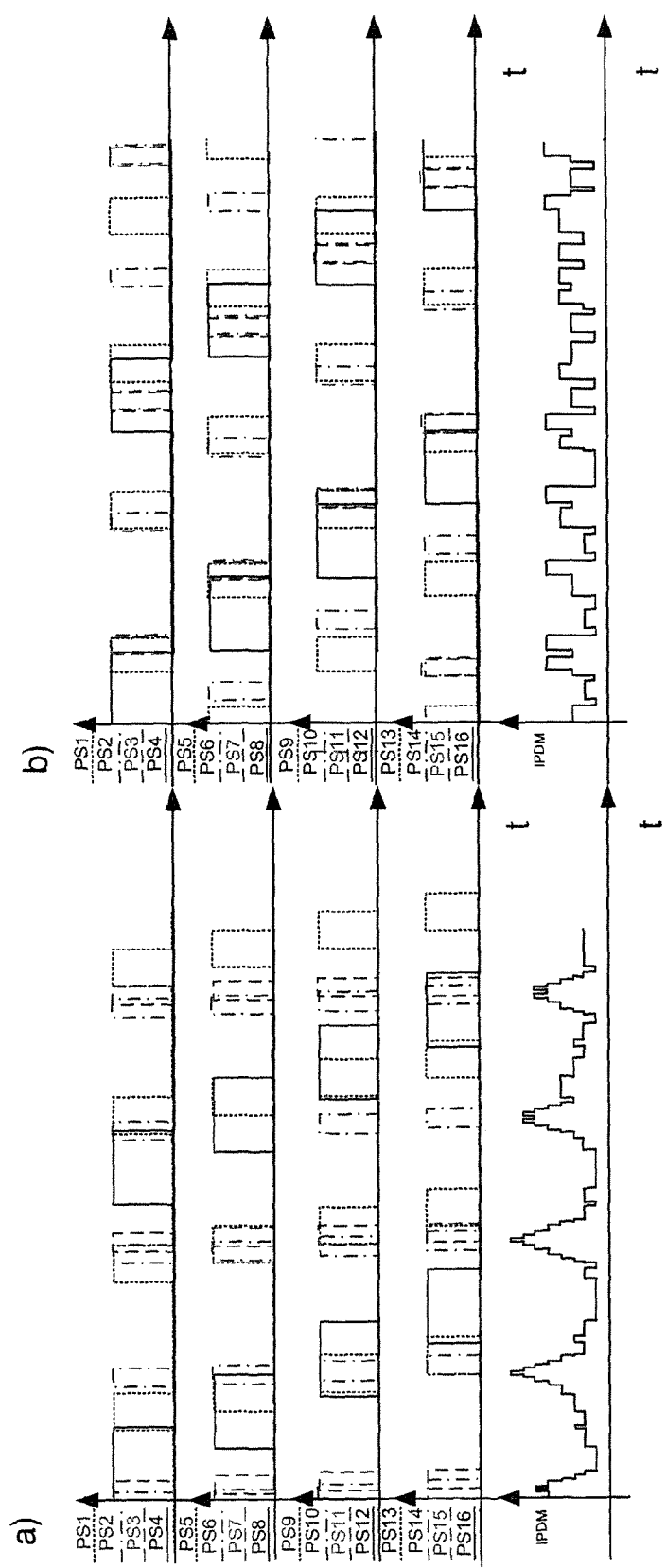
FIG. 14 shows the distribution of the pulses in a system of power supplies feeding an ESP: (a) optimization procedure evolving by fields (b) optimization procedure evolving by rows.
Figure 15:
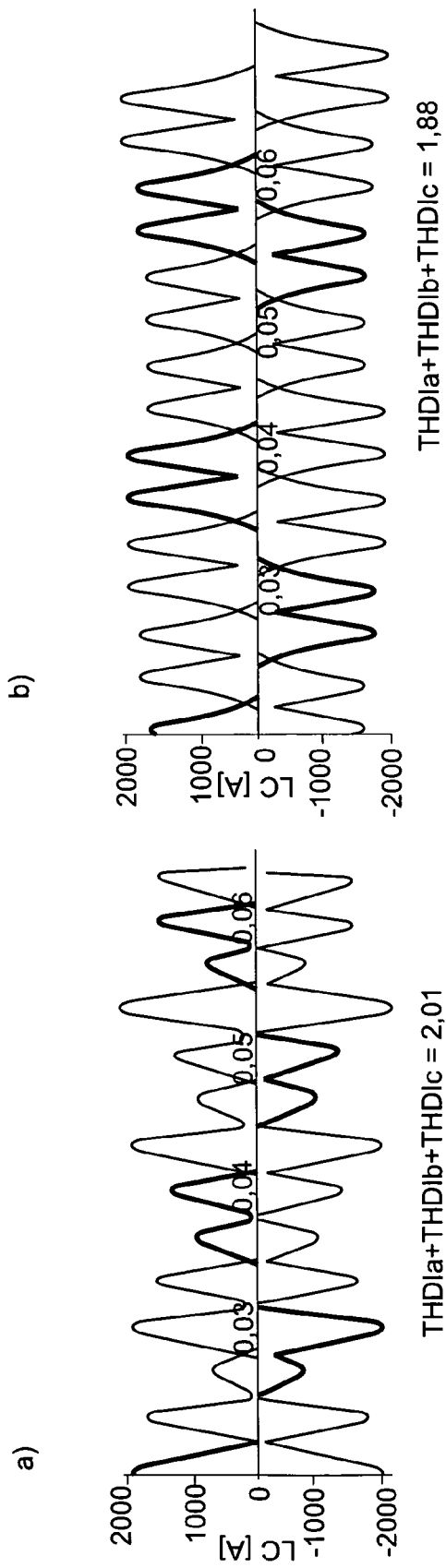
FIG. 15 shows the system line currents for arrangement of pulses described in FIG. 14: (a) optimization procedure by fields (b) optimization procedure evolving by rows.

As can be observed in FIG. 14, in the optimization evolving by row, the sequence of pulses in different rows are the same. Moreover, the pulses located in the same field are normally well distributed. In this situation, there is better equilibrium of power consumption among the system's rows and therefore they have very similar particles collection efficiency.

The power supplies of each field have quite different values of PW (0.8 ms of field 2 is very small compared to 3 ms of Field 4) and also a high overlap gap (in the order of PW in the Field 2 and 3). Thus, due to the negative gap in the order of the PW in Field 2 and 3, equation (1) makes the pulse in these fields to be released at almost the same time instant. On the other hand, if the power supplies had similar pulse widths and also the overlap of pulses did not occur, both optimization by Field and Cell would lead to similar results.

The improvement in line power quality achieved with the scheduling strategy was verified experimentally by a 240 kVA capability system, comprising two commercially available ESP power supplies. Both power supplies are fed by a common feeding (the same mains) and set to operate in pulsed mode with configuration of 5 ms pulse width and 10 ms pulse period. FIGS. 16a) and b) presents the results for the case where each power supply pulse is arranged to occur at the same time. The optimized system behavior is shown in FIG. 16c, where a pulse delay of 5 ms is set between the two power supplies. The characteristics of both experiments, in particular the RMS-values for the line currents are given in the list of reference numerals, and the total harmonic distortion of the current in the critical case (FIG. 16b) are 43.2%; 88%; 82.14% for channels 1-3, respectively, while the corresponding values for the optimised case (FIG. 16c) are 43.7%; 44.3% and 45.8% for channels 1-3, respectively.

Figure 16:
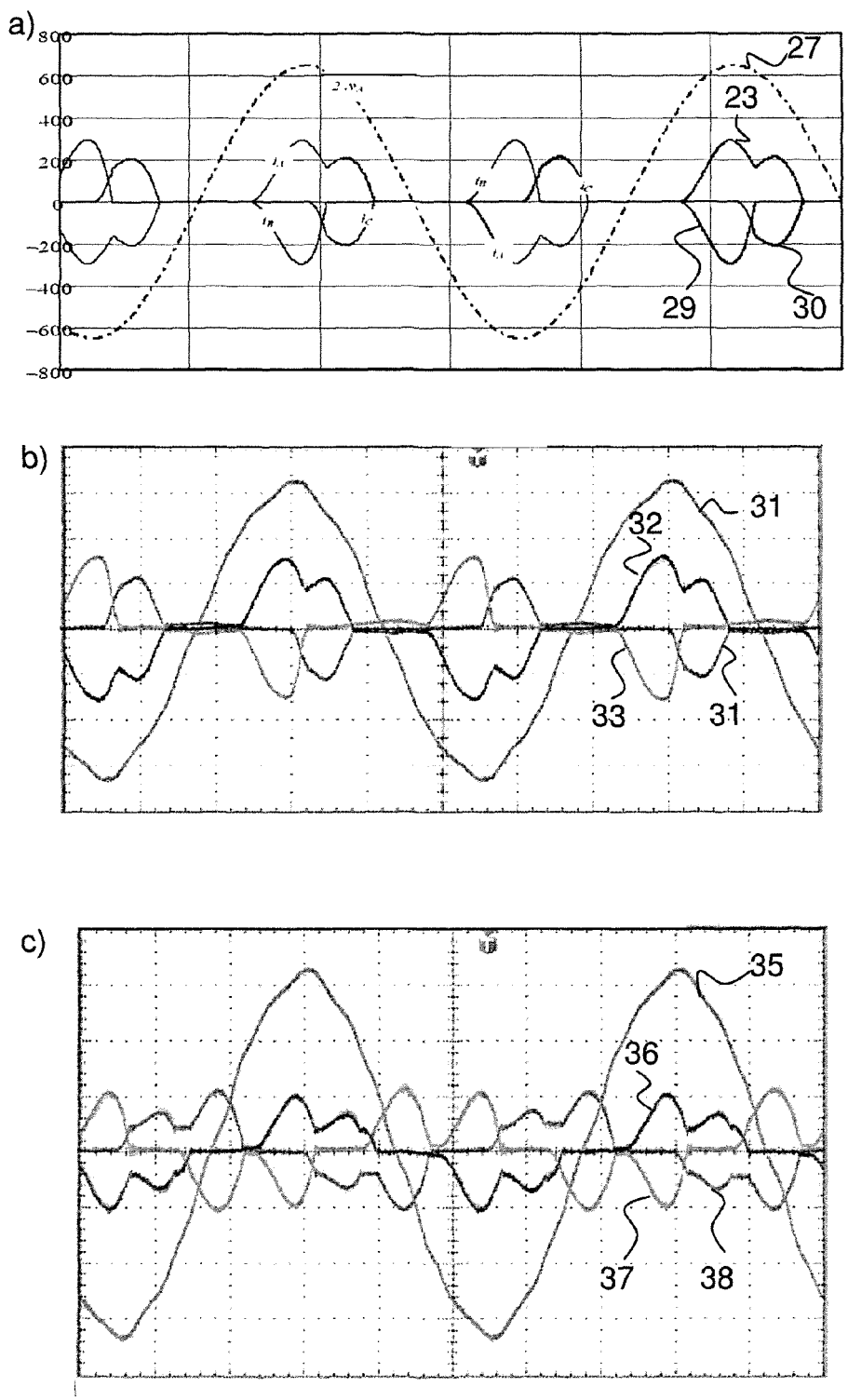
FIG. 16 shows the critical case: (a) Line current model prediction; (b) Experimental set-up waveforms and in (c) the optimized case: Experimental set-up waveforms.

In FIG. 16 the accuracy of the ESP experimented system model is verified, where the experimental results are compared to the ones predicted by the model. There, a very good correspondence can be observed, validating the model analytical considerations.

Analyzing the experimental data given above, one can list the advantages of the pulse scheduling strategy: reduction of power consumption; reduction of line current peak value; better current THD; better power balance among mains phase; better utilization of mains components.

LIST OF REFERENCE SIGNS

| | |
|---|---|
| 1 | mains, common feeding |
| 2 | low or medium voltage level line |
| 3 | distribution transformer |
| 4 | gas flow loaded with particles, e.g. coal dust |
| 5 | electrostatic precipitator |
| 6 | inlet field |
| 7 | middle fields |
| 8 | outlet field |
| 9 | stack |
| 10 | cleaned exhaust gas |
| 11 | power supply |
| 12 | input rectifier |
| 13 | full bridge inverter |
| 14 | resonant tank and transformer |
| 15 | output rectifier |
| 16 | current and/or voltage sensor |
| 18 | DC link capacitor |
| 19 | capacitor in series |
| 20 | inductor in series |
| 21 | transformer |
| 22 | drivers |
| 23 | control unit |
| 25 | control unit |
| 26 | stack |
| 27 | input waveform, model |
| 28 | channel 1 line current, model prediction critical case, RMS 156A |
| 29 | channel 2 line current, model prediction critical case, RMS 126A |
| 30 | channel 3 line current, model prediction critical case, RMS 94A |
| 31 | input waveform, experimental, critical case |
| 32 | channel 1 line current, experimental, critical case, RMS 161A |
| 33 | channel 2 line current, experimental, critical case, RMS 130A |
| 34 | channel 3 line current, experimental, critical case, RMS 91.5A |
| 35 | input waveform, experimental, optimised case |
| 36 | channel 1 line current, experimental, optimised case, RMS 100A |
| 37 | channel 2 line current, experimental, optimised case, RMS 110A |
| 38 | channel 3 line current, experimental, optimised case, RMS 107A |
| ESP | electrostatic precipitator |
| PS | power supply |
| #PS | number of power supplies |
| PS1 | power supply 1 |
| PS2 | power supply 2 |
| ... | |
| PS15 | power supply 15 |
| PS16 | power supply 16 |
| δ | delay between pulses of different power supplies, e.g. $\delta_{412}$ is the delay between the pulse of PS4 and PS12 |
| Z1 | electrostatic precipitator bus section 1 |

-continued

| | |
|---|---|
| Z2 | electrostatic precipitator bus section 2 |
| Z3 | electrostatic precipitator bus section 3 |
| Z4 | electrostatic precipitator bus section 4 |
| Z5 | electrostatic precipitator bus section 5 |
| t | time |
| LC | line current |

The invention claimed is:

1. A method for scheduling or operating a system comprising:
    at least two power supplies providing DC pulses to a consumer, the consumer being an electrostatic precipitator operated in at least one bus section in pulsed mode and in at least one further bus section in continuous mode; and
    a common feeding energising the at least two power supplies;
    wherein one power supply is defined as a reference power supply, with initial pulses of each further power supply shifted by controlled delays from pulses of the reference power supply, to fill gaps between the pulses of the reference power supply with the pulses of the further power supplies.

2. The method according to claim 1, wherein the reference power supply is the power supply with a largest pulse period.

3. The method according to claim 1, wherein the consumer is an electrostatic precipitator operated in pulsed mode.

4. The method according to claim 1, wherein the controlled delays are set to uniformly distribute the pulses of the further power supplies in the gaps between the pulses (pulse period) of the reference power supply, and, if the accumulated pulse width of all power supplies is smaller than the largest pulse period, the controlled delays are set so gaps between all pulses are equal, if the accumulated pulse width of all power supplies is equal to the largest pulse period, the controlled delays are set for no gaps between pulses, and if the accumulated pulse width of all power supplies is larger than the largest pulse period, the controlled delays are set so overlap length of each pulse is equal.

5. The method according to claim 1, wherein the delays of the further power supplies are calculated sequentially using the following formula:

$$\delta_{Pri} = k \frac{T p_r - \sum_{z=1}^{n_{PS}} PW_{PSz}}{n_{PS}} + PW_{PSr} + \sum_{z \neq r=0}^{i-1} PW_{PSz} \quad (1)$$

wherein $\delta_{Pri}$ is controlled delay of power supply i, $T_{Pr}$ is pulse period of the reference power supply with the largest pulse period, $n_{PS}$ is the total number of power supplies in the system operated in pulsed mode, $PW_{PSz}$ is the pulse width of the power supply with index z, $PW_{PSr}$ is the pulse width of the reference power supply and k is running index incremented for each subsequent calculation of the controlled delay for subsequent power supply.

6. The method according to claim 5, wherein in a first step, the power supply with the largest pulse period is selected; in a second step, indices 1 and k are set to 1; and in a third step, a considered power supply is verified as the reference power supply and set to 0, i incremented by one, and the process continues to the second step; if no controlled delay is calculated according to formula (1), the running index k is incremented by one, and if the value of i is still smaller than the longest pulse period, the index i is also incremented by one and the process continues to the second step; and if the value of i is equal to or larger than the total number of power supplies, the calculation is terminated.

7. The method according to claim 1, wherein the system comprises at least two groups of power supplies with at least two power supplies each, with each group of power supplies operated with a same pulse period and a same pulse width, and a first optimisation step, independently in each group the power supplies within each group are scheduled by setting of the controlled delays to fill the gaps between the pulses of a reference power supply of the group by the pulses of the further power supplies of the group.

8. The method according to claim 7, wherein the first optimisation step is followed by a second optimisation step comprising scheduling groups relative to each other by setting the controlled delays to fill gaps between the pulses of the individual groups, and taking the group with the largest pulse period as the reference power supply, without modifying scheduling within each group.

9. The method according to claim 1, wherein the system comprises at least two groups of power supplies with at least two power supplies each, with each group of power supplies operated with the same pulse period, and sequentially controlled delays are set within a first group with a largest pulse period for each other power supplies within that first group, followed by sequential setting of controlled delays of each of the power supplies of the following groups.

10. The method according to claim 1, wherein the system comprises at least two groups of power supplies with at least two power supplies each, with each group of power supplies operated with the same pulse period, and sequentially controlled delays are set for a first power supply of a first group with a largest pulse period followed by setting of the controlled delay the first power supply of a second group until the first power supplies of all groups have been attributed a controlled delay, followed by setting of the controlled delay of the second power supply of the first group, until the second power supplies of all groups have been attributed a controlled delay, and continuing with further groups until all power supplies have been attributed a controlled delay.

11. The method according to claim 1, wherein the power supplies are one or three phase, 50 Hz or 60 Hz based power supplies, high voltage transformer based, IGBT based converters, series loaded resonant converters for higher power and high voltage, with said high power in a range of 10-200 kW or said high voltage in a range of 50-150 kV DC.

12. The method according to claim 1, wherein the pulses of direct current provided to the consumer are pulse widths in the range of 0.1-20 ms, or are pulse periods in the range of 0.5 ms-2 s, with pulse ratio of pulse width divided by pulse period in the range of 1-1/2000.

13. The method according to claim 1, wherein the consumer is an electrostatic precipitator operated in at least one bus section in pulsed mode, comprising at least one further bus section operated in pulsed mode, and comprising at least one further bus section operated in pulsed mode, wherein in each bus section at least two individual power supplies are provided and all power supplies of the electrostatic precipitator energised by the same common feeding.

14. The method according to claim 1, further comprising using the method in operating an electrostatic precipitator acting as a gas cleaning unit in an industrial application of a power plant, a fossil fuel-based power plant, or a coal-fired power plant.

* * * * *